United States Patent
Hiratsuka et al.

(12)
(10) Patent No.: US 6,473,312 B1
(45) Date of Patent: Oct. 29, 2002

(54) PRINTED CIRCUIT BOARD, PRINTED CIRCUIT BOARD MODULE AND ELECTRONIC DEVICE ADAPTING SAME

(75) Inventors: Yoshiaki Hiratsuka, Kawasaki (JP); Masanori Yamaguchi, Kawasaki (JP); Hisashi Yoshinaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/642,023

(22) Filed: Aug. 21, 2000

(30) Foreign Application Priority Data

Dec. 13, 1999 (JP) .......................... 11-353726

(51) Int. Cl.[7] ............................... H05K 1/11
(52) U.S. Cl. ................. 361/794; 361/792; 361/793; 361/780; 174/255; 257/724; 257/700
(58) Field of Search .................. 361/794, 762, 361/766, 779, 780, 795, 705, 736, 750, 792, 793; 257/700, 724; 174/255; 333/12, 246

(56) References Cited

U.S. PATENT DOCUMENTS

| 5,131,140 A | * | 7/1992 | Zimmer ........................ 174/261 |
| 5,574,630 A | * | 11/1996 | Kresge et al. ............... 361/792 |
| 5,736,796 A | * | 4/1998 | Price et al. .................. 307/147 |
| 5,764,491 A | * | 6/1998 | Tran ........................... 174/260 |
| 5,926,377 A | * | 7/1999 | Nakao et al. ................ 361/763 |

FOREIGN PATENT DOCUMENTS

JP 08-153975 6/1996

* cited by examiner

Primary Examiner—David Martin
Assistant Examiner—Hung Bui
(74) Attorney, Agent, or Firm—Armstrong, Westerman & Hattori, LLP.

(57) ABSTRACT

A printed circuit board includes a ground layer, a power supply layer divided into a plurality of lands, a dielectric layer disposed so as to cover the plurality of lands of the power supply layer, and a conductor layer disposed so as to cover the dielectric layer. The plurality of divided lands are coupled to each other by electrostatic capacitors formed by each of the lands of the power supply layer and the conductor layer sandwiching the dielectric layer therebetween.

14 Claims, 8 Drawing Sheets

PRINTED CIRCUIT BOARD, PRINTED CIRCUIT BOARD MODULE AND ELECTRONIC DEVICE ADAPTING SAME

BACKGROUND OF THE INVENTION

1. Field of the Invention

The present invention relates generally to a printed circuit board, a printed circuit board module, and an electronic device adapting same, and more particularly, to a printed circuit board, a printed circuit board module, and an electronic device adapting same in which the power supply layer is divided into a plurality of lands.

2. Description of the Related Art

Electronic devices typically contain one or more printed circuit board modules, in which a variety of electronic elements are mounted atop a printed circuit board. However, in such a configuration, electromagnetic waves radiating from the printed circuit board can cause the electronic device to malfunction. Accordingly, in order to improve the reliability of such devices it is necessary to restrict the radiation of these electromagnetic waves from the printed circuit board.

In order to further an understanding of the problem the present invention attempts to solve a description will now be given of noise currents.

When the electronic elements operate, noise such as switching noise is generated. Hereinafter, the current caused by such noise is referred to as noise current.

It is known that the intensity of these electromagnetic waves is related to the size of the area of the return loop through which the noise current flows, so that the larger the area enclosed by the loop the stronger the electromagnetic wave radiation. It should be noted that the term "return loop" refers to the closed path along which the noise current flows from the noise source back to the noise source.

Accordingly, in order to suppress the electromagnetic waves radiating from the printed circuit board, it is desirable that the area enclosed by the loop-like return path through which the noise current flows be as small as possible. It should be noted that the return path through which the noise current flows is the path of least load resistance. Therefore, it is desirable that such a path enclose the smallest possible area.

Additionally, electronic devices have come to be loaded with an increasing number of functions to make data processing faster. In order to accommodate these added demands it has become necessary to mount electronic elements of different operating voltages on the printed circuit board. These operating voltages may for example be 5 V, 3 V, and 2.8 V.

An additional requirement particularly with respect to portable electronic devices is that battery power be conserved and the life of the battery extended. In order to accomplish this aim, the printed circuit board is mounted with a plurality of circuits having different functions. Power is then turned ON not to the entire printed circuit board but only to each of those circuits requiring power, and the power is turned OFF with respect to those circuits whose operations are not required, thus saving battery power.

It will be appreciated by those skilled in the art that, in order to be able to supply power selectively, that is, to selected portions of a printed circuit board mounted with electronic elements having different operating voltages, the printed circuit board must have either a plurality of power supply layers or a single power supply layer divided into a plurality of lands that are electrically insulated from each other.

Providing a plurality of power supply layers complicates the structure of the printed circuit board, and reduces the production yield of the printed circuit board. Accordingly, the conventional solution is to divide the single power supply layer on the printed circuit board into a plurality of mutually electrically insulated lands.

FIG. 1 shows perspective and cross-sectional views of a conventional printed circuit board 10 and a portion of a conventional printed circuit board module 20. The drawing at the right of FIG. 1 is the cross-sectional view of the printed circuit board 10. The drawing at the left of FIG. 1 is a schematic rendering of the printed circuit board 10 drawn to emphasize a power supply layer 11, a dielectric layer 12 and a ground layer 13. The drawing at the right represents a cross-sectional view along a line I—I of the drawing at the left.

As shown in the diagram, the portion of the printed circuit board 10 shown in FIG. 1 has the power supply layer 11 divided into a plurality of mutually electrically insulated lands A, B and C. The dielectric layer 12 and the ground layer 13 are provided beneath the power supply layer 11. Another dielectric layer 14 and a signal layer 15 are provided above the power supply layer 11. The dielectric layer 12 disposed between the power supply layer 11 and the ground layer 13 forms the land A and the ground layer 13 into a capacitor Ca, the land B and the ground layer 13 into a capacitor Cb and the land C and the ground layer 13 into a capacitor Cc. A voltage Va is applied across the ground layer and the land A, a voltage Vb is applied across the ground layer and the land B, and a voltage Vc is applied across the ground layer and the land C.

As shown in the diagram, electronic elements are disposed atop the lands having the appropriate operating voltages. An electronic element 30, for example, has an operating voltage Vc and is thus mounted on the land C. Similarly, an electronic element 31 has an operating voltage Va and is thus mounted on the land A.

Normally, an electronic element, like the electronic element 30 shown in FIG. 1, has all its terminals positioned atop the same land. However, some electronic elements, such as the electronic element 31 shown in FIG. 1, electrically straddle two lands, in this case land A and land B. As a result, a ground terminal Pg31 of electronic element 31 to be connected to the ground layer 13 is positioned not so as to oppose the land A but so as to oppose the land B.

As shown in FIG. 1, NS30 is the source of noise generated by the operation of the electronic elements as described above, in this case electronic element 30. Similarly, NS31 is the source of noise generated by the operation of the electronic elements as described above, in this case electronic element 31. A noise current i30 from the noise source NS30 flows through a loop-like return circuit indicated in the drawing by reference numeral 40 via the ground layer 13 through the capacitor Cc to the 30 land C and back to the noise source NS30. As can be seen from the drawing, the area enclosed by this return path 40 is extremely small and hence the electromagnetic waves generated from the noise source NS30 are weak.

By contrast, consider a noise current i31 from the other noise source NS31 and the path along which it returns to the noise source NS31. As noted above, the land B is electrically insulated from the land A. The noise current i31, flows along a return path indicated by reference numeral 41, that is, from the ground layer 13 to the capacitor Ca to the land A and back to the noise source NS31. The area enclosed by this loop is large and hence the electromagnetic waves generated from the noise source are strong.

Accordingly, the above-described printed circuit board 10 and printed circuit board module 20 are not capable of adequately suppressing electromagnetic wave radiation.

It should be noted that although FIG. 1 shows the capacitors Ca, Cb and Cc as a single line connecting two opposed layers, in actuality the entire areas of the opposed layers or plates form the capacitors Ca, Cb and Cc. The same holds true of FIGS. 2 and 4 which will be described later.

Additionally, although the loop-like return path shown on the left of FIG. 1 would appear to be three-dimensional, in actuality a direction in a thickness of the printed circuit board has been exaggerated compared to a horizontal direction of the printed circuit board for purposes of illustrative clarity only. It is understood by those of skill in the art that in actuality the direction in the thickness of the path is so small that it can be ignored and that the area enclosed by the loop-like return path is essentially a flat surface.

FIG. 2 shows perspective and cross-sectional views of another conventional printed circuit board 10A and printed circuit board module 20A. The drawing at the left of FIG. 2 is of the printed circuit board 10A, drawn to emphasize the power supply layer 11, the dielectric layer 12 and the ground layer 13. The drawing at the right of FIG. 2 represents a cross-sectional view of the printed circuit board 10A at left along a line I—I. It should be noted that elements shown in FIG. 2 that are corresponding or identical to elements shown in FIG. 1 are given identical or corresponding reference numbers, with detailed descriptions thereof omitted.

The printed circuit board 10A shown in FIG. 2 is essentially the same as the printed circuit board 10 shown in FIG. 1, with the addition of bypass capacitors 50-1 through 50-4 each having a capacitance of from 100 to 1,000 pF. Bypass capacitors 50-1, 50-2 straddle the lands A and B. Bypass capacitor 50-3 straddles the lands B and C. Bypass capacitor 50-4 straddles the lands A and C.

The noise current i30 from the noise source NS30 related to electronic element 30 flows along the same return path 40 described above and returns to the noise source NS30.

The noise current i31 from the noise source NS31 related to the electronic element 31 flows along a return path indicated by reference numeral 51, that is, from the ground layer 13 to the capacitor Cb to the land B to the bypass capacitor 50-1 to the land A and then to the noise source NS31. This return path 51 encloses an area smaller than the area enclosed by the return path 41 described above, and accordingly, the printed circuit board 10A and the printed circuit board module 20A shown in FIG. 2 show improved electromagnetic wave suppression characteristics as compared to the printed circuit board 10 and printed circuit board module 20 shown in FIG. 1.

However, the printed circuit board and printed circuit board module having the structure described above have the following drawbacks.

First, as electronic devices have become more compact the size of the printed circuit board 10A has decreased, making it physically more difficult to mount the bypass capacitors used to suppress the electromagnetic wave radiation. Additionally, use of the bypass capacitors takes up space and restricts the placement of other electrical elements, which in turn affects the layout of the wiring of underlying layers because the wiring must be positioned beneath the electronic elements.

Second, and as one consequence of the limitations on design freedom described above, the bypass capacitors cannot always be positioned so as to create loops having minimal enclosed areas. As a result, adequate electromagnetic wave radiation suppression cannot always be obtained.

SUMMARY OF THE INVENTION

Accordingly, it is an object of the present invention to provide a printed circuit board, a printed circuit board module, and an electronic device adapting same, in which the problems described above are solved.

The above-described object of the present invention is achieved by a printed circuit board comprising:

a ground layer;

a power supply layer divided into a plurality of lands;

a dielectric layer disposed so as to cover the plurality of lands of the power supply layer; and a conductor layer disposed so as to cover the dielectric layer, the plurality of divided lands being coupled to each other by electrostatic capacitors formed by each of the lands of the power supply layer and the conductor layer sandwiching the dielectric layer therebetween.

According to this aspect of the invention, the loop formed by the noise current return path is reduced as is the area enclosed by the loop, thus suppressing electromagnetic wave radiation form the printed circuit board.

Additionally, the above-described object of the present invention is also achieved by the printed circuit board as described above, further comprising:

a high-resistance conductor layer which covers the surface of the conductor layer, the high-resistance conductor layer being electrically coupled to the ground layer.

According to this aspect of the invention, an electrical charge accumulating on the high-resistance conductor layer is released to the ground layer, so that no charge is accumulated in the high-resistance conductor layer.

Additionally, the above-described object of the present invention is also achieved by the printed circuit board as described above, further comprising:

a high-resistance conductor layer which covers the surface of the conductor layer, the high-resistance conductor layer being electrically coupled to the lands of the power supply layer.

According to this aspect of the invention, an electrical charge accumulating on the high-resistance conductor body is released to the lands of the power supply, so that no charge is accumulated in the high-resistance conductor layer.

Additionally, the above-described object of the present invention is also achieved by the printed circuit board as described above, further comprising:

a capacitor and a resistance which are coupled in series between the conductor layer and the ground layer.

According to this aspect of the invention, harmonics of the electromagnetic waves radiated from the printed circuit board are suppressed even if these coincide with the resonance frequencies of the printed circuit board.

Additionally, the above-described object of the present invention is also achieved by a printed circuit board module comprising:

a printed circuit board, the printed circuit board comprising:

a ground layer;

a power supply layer divided into a plurality of lands;
a dielectric layer disposed so as to cover the plurality of lands of the power supply layer; and
a conductor layer disposed so as to cover the dielectric layer,
the plurality of divided lands being coupled to each other by electrostatic capacitors formed by each of the lands of the power supply layer and the conductor layer sandwiching the dielectric layer therebetween.

According to this aspect of the invention, electromagnetic wave radiation from the printed circuit board is suppressed.

Additionally, the above-described object of the present invention is also achieved by an electronic device comprising:
a printed circuit board module,
the printed circuit board module comprising a printed circuit board,
the printed circuit board comprising:
a ground layer;
a power supply layer divided into a plurality of lands;
a dielectric layer disposed so as to cover the plurality of lands of the power supply layer; and
a conductor layer disposed so as to cover the dielectric layer,
the plurality of divided lands being coupled to each other by electrostatic capacitors formed by each of the lands of the power supply layer and the conductor layer sandwiching the dielectric layer therebetween.

According to this aspect of the invention, electromagnetic wave radiation from the printed circuit board is suppressed. Additionally, electrostatic discharge can be avoided, thereby improving the reliability of the electronic device.

Other objects, features and advantages of the present invention will become more apparent from the following detailed description when read in conjunction with the accompanying drawings.

DESCRIPTION OF THE PREFERRED EMBODIMENTS

A description will now be given of embodiments of the present invention, with reference to the accompanying drawings.

Figure 3:
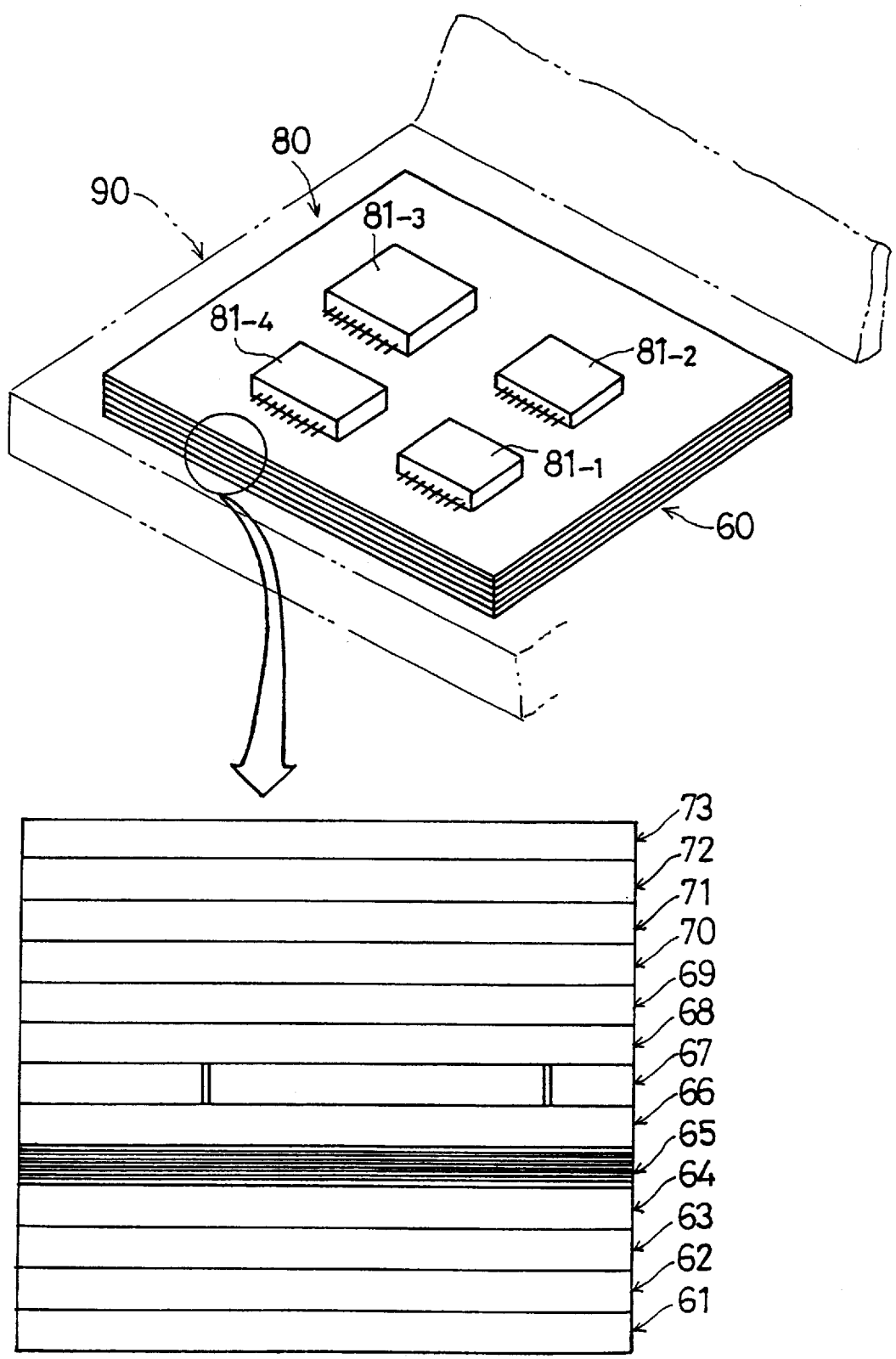
FIG. 3 is a diagram showing a printed circuit board, printed circuit board module and a lap-top personal computer as the electronic device according to a first embodiment of the present invention.

FIG. 3 shows a printed circuit board 60, printed circuit board module 80 and a lap-top personal computer 90 as the electronic device according to a first embodiment of the present invention.

The printed circuit board module 80, which mounts a plurality of integrated circuit elements 81-1 through 81-4 atop the printed circuit board 60, is itself contained within the lap-top personal computer 90.

A description will now be given of the printed circuit board 60.

The printed circuit board 60 is shown on an enlarged scale at the bottom of FIG. 3. The printed circuit board 60 comprises, in order from the bottom: a signal layer 61, a glass fabric based epoxy resin substrate layer 62, a signal layer 63, a glass fabric based epoxy resin substrate layer 64, a ground layer 65, a glass fabric based epoxy resin substrate layer 66, a power supply layer 67, a dielectric layer 68, a conductor layer 69, a glass fabric based epoxy resin substrate layer 70, a signal layer 71, a glass fabric based epoxy resin substrate layer 72 and a signal layer 73.

Figure 4:
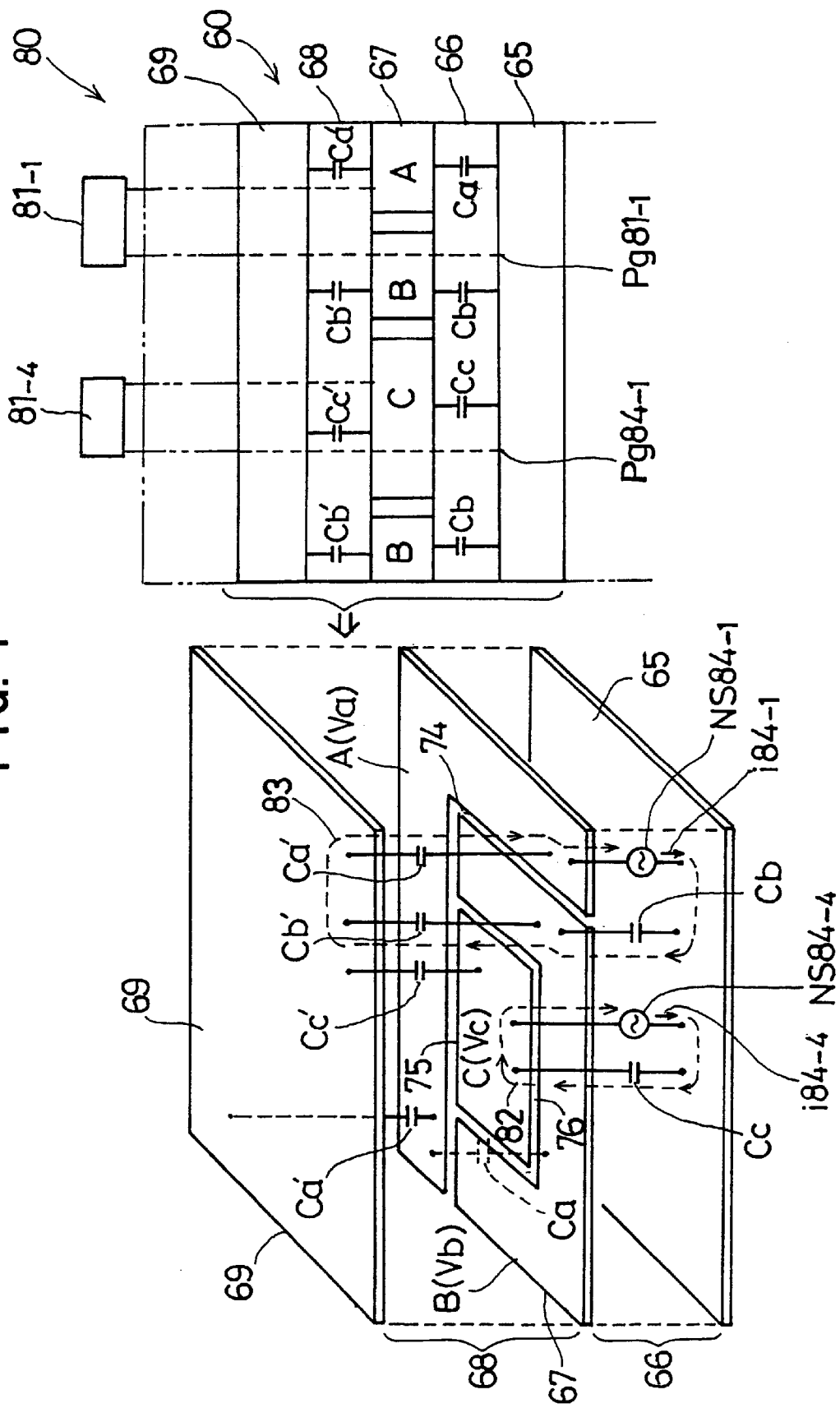
FIG. 4 is a diagram showing an essential part of the printed circuit board shown in FIG. 3 in schematic form.

FIG. 4 shows an essential part of the printed circuit board 60 shown in FIG. 3 in schematic form. As shown in the diagram, the power supply layer 67 is divided into a plurality of lands A, B, C, with each of the lands electrically insulated from each other. In the drawing, reference numeral 74 indicates a boundary line between the land A and the land B, reference numeral 75 indicates a boundary line between the land A and the land C, and reference numeral 76 indicates a boundary line between the land B and the land C. A voltage applied to the land A is Va, a voltage applied to the land B is Vb and a voltage applied to the land C is Vc.

For clarity of explanation, a description will first be given of a structure of an underside of the power supply layer 67.

The substrate layer 66 is disposed beneath the power supply layer 67. The ground layer 65 is disposed beneath the substrate layer 66. It will be appreciated that the power supply layer 67 and the ground layer 65 sandwich the substrate layer 66 therebetween, thus forming a capacitor Ca between the land A and the ground layer 65, a capacitor Cb between the land B and the ground layer 65, and a capacitor Cc between the land C and the ground layer 65. Accordingly, the land A and the ground layer 65 are electrically connected to each other via the capacitor Ca. Similarly, the land B and the ground layer 65 are electrically connected to each other via the capacitor Cb, and the land C and the ground layer 65 are electrically connected to each other via the capacitor Cc.

That is, an electrical connection is established between the underside of the land A and the underside of the land B as if the land A and the land B were connected by a multiplicity of bypass capacitors across the entire length of the boundary line 74. Similarly, an electrical connection is established between the undersides of the land A and the land C via the capacitor Ca, the ground layer 65 and the capacitor Cc, as if the lands A and C were connected by a multiplicity of bypass capacitors across the entire length of the boundary line 75. Likewise, an electrical connection is established between the undersides of lands B and C via the capacitor Cb, the ground layer 65 and the capacitor Cc, as if the lands B and C were connected by a multiplicity of bypass capacitors across the entire length of the boundary line 76.

A description will now be given of an upper side of the power supply layer 67.

The dielectric layer 68 is disposed atop the upper side of the power supply layer 67. The conductor layer 69 is disposed atop the dielectric layer 68. The dielectric layer 68 may be made of a polyamide-based resin, polyvinylalcoholbased resin or a resin having a cyano group resin, and has a high relative dielectric constant of 20 to 100. It should be noted that future technological developments may yield materials with yet higher relative dielectric constants. Such after-developed materials may be used for the dielectric layer 68 of the present invention and will further enhance the effect described herein.

In the state described above, in which the power supply layer 67 and the conductor layer 69 sandwich the dielectric layer 68, a capacitor Ca' is formed between the land A and the conductor layer 69 by the dielectric layer 68. Similarly, a capacitor Cb' is formed between the land B and the conductor layer 69, and a capacitor Cc' is formed between the land C and the conductor layer 69. Accordingly, the land A and the conductor layer 69 are electrically connected to each other across the entire surface of the land A via the capacitor Ca'. Similarly, the land B and the conductor layer 69 are electrically connected to each other across the entire surface of the land B via the capacitor Cb'. Likewise, the land C and the conductor layer 69 are electrically connected across the entire surface of the land C via the capacitor Cc'. The capacitance of each of the capacitors Ca', Cb' and Cc' may, for example, range from 100 to 1,000 pF.

Accordingly, the upper surface of the land A and the upper surface of the land B are electrically connected to each other via a circuit comprising the capacitor Ca', the conductor layer 69, and the capacitor Cb'. That is, the upper surfaces of land A and land B are electrically connected to each other as if a multiplicity of bypass capacitors were ranged along the entire length of the boundary line 74. Similarly, the upper surfaces of land A and land C are electrically connected to each other via the capacitor Ca', the conductor 69 and the capacitor Cc', as if a multiplicity of bypass capacitors were ranged along the entire length of the boundary line 75. Likewise, the upper surfaces of lands B and C are electrically connected to each other via the capacitor Cb', the conductor layer 69 and the capacitor Cc', as if a multiplicity of bypass capacitors were ranged along the entire length of the boundary line 76. In other words, the separate lands A, B and C are electrically connected to each other via the electrostatic capacitor formed by the power supply layer 67 and the dielectric layer 68 and the conductor layer 69.

A description will now be given of the printed circuit board module 80.

As shown in FIGS. 3 and 4, the integrated circuit elements 81-1 through 81-4 are mounted on those lands having the operating voltages appropriate to those components. Thus, for example, the IC element 81-3 has an operating voltage Vc and is therefore mounted atop the land C. Similarly, the IC element 81-1 has an operating voltage Va, and is thus mounted atop the land A.

Normally, all the terminals of an electronic element such as the IC element 81-3 are situated atop the same land. However, some electronic components, such as the electronic component 81-1, straddle two adjacent lands (in this case lands A and B). The term "straddle" is meant electrically, so that, in the case of the electronic component 81-1, a position Pg81-1 at which the ground terminal would be connected to the ground layer 65 is disposed not opposite the land A but opposite the adjacent land B.

A description will now be given of the suppression of electromagnetic wave radiation caused by noise currents, with reference to FIG. 4.

In FIG. 4, a noise source NS81-1 is generated when the IC element 81-1 is switched ON. Similarly, a noise source NS81-4 is generated when the IC element 81-4 is switched ON. It will be seen that noise sources 81-1 and 81-4 exist between the power terminals of the IC elements 81-1 and 81-4 on the one hand and the ground layer 65 on the other.

A noise current i84-4 generated from the noise source NS84-4 flows through a loop-like return path indicated in the drawing by a reference numeral 82 via the ground layer 65, the capacitor Cc, the land C and then back to the noise source NS84-4. The area enclosed by this loop-like return path 82 is small and so the electromagnetic waves generated from the noise current i84-4 are weak.

By contrast, consider the loop-like return path followed by a noise current i84-1 generated from the noise source NS84-1. This noise current i84-1 follows a loop-like return path indicated in FIG. 4 by a reference numeral 83, from the ground layer 65 to the capacitor Cb to the land B to the capacitor Cb' to the conductor layer 69 to the capacitor Ca' to the land A, then back to the noise source NS84-1.

A more detailed description will now be given of the return path 83.

As shown in FIG. 4, the upper surfaces of land A and land B are electrically connected to each other by a circuit comprising the capacitor Ca', the conductor layer 69 and the capacitor Cb', so the noise current i84-1 from the noise source NS84-1 flowing to the ground layer 65 flows not toward the capacitor Ca but toward the capacitor Cb. The capacitor Cb is located very close to the point at which the noise current i84-1 flows into the ground layer 65, so the return path from the noise source NS81 via the ground layer 65 to the underside of the land B is very short.

As described above, the upper surfaces of the land A and the land B are electrically connected to each other as if a multiplicity of bypass capacitors were ranged along the entire length of the boundary line 74, so the noise current i84-1 flows through those capacitors Cb' and Ca' positioned nearest the noise source 84-1. Accordingly, the return path formed by the land B, the capacitor Cb', the conductor layer 69, the capacitor Ca' and the land A through which the noise current i84-1 flows is also very short.

Figure 1:
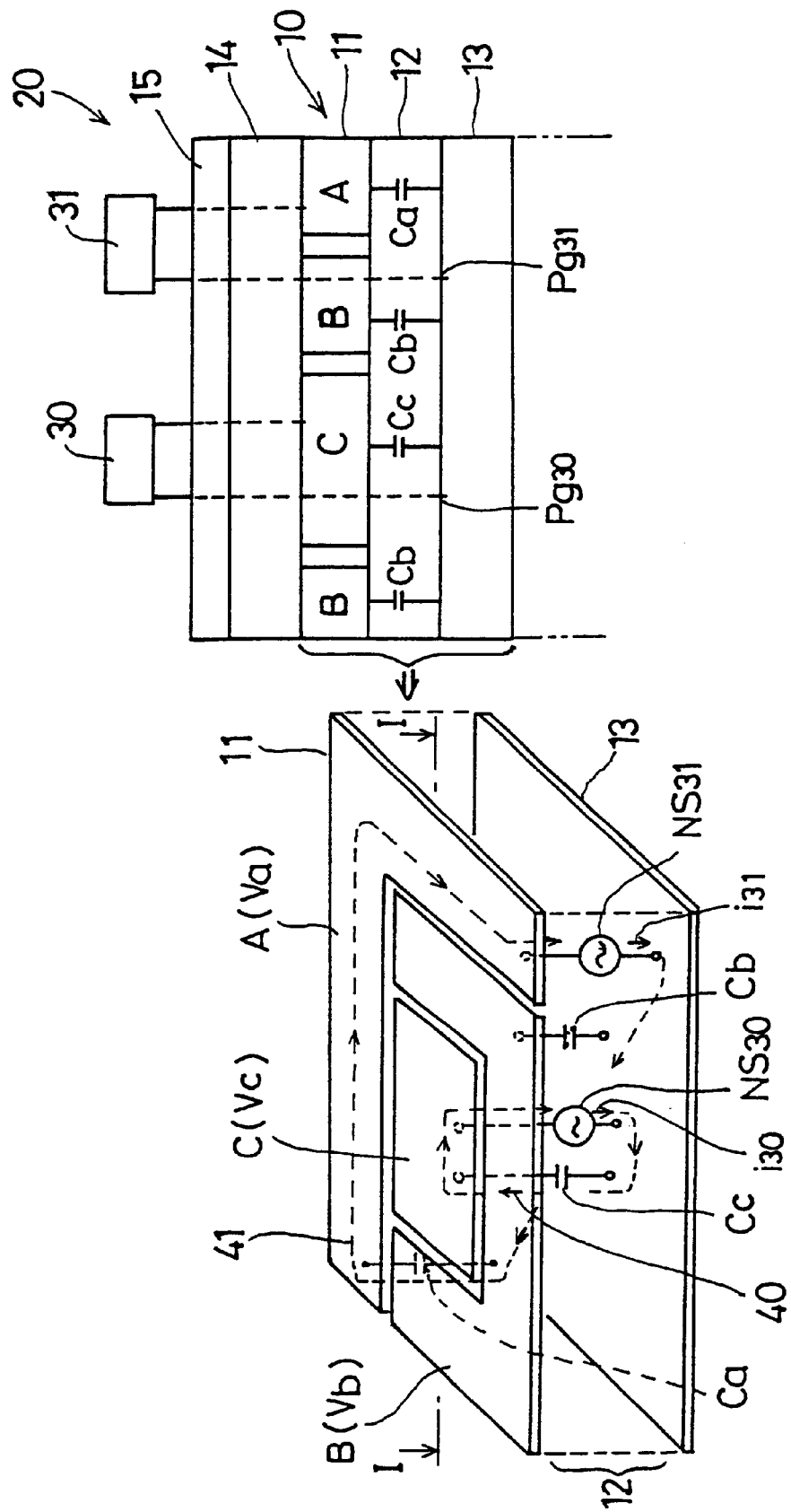
FIG. 1 is a diagram showing perspective and cross-sectional views of a conventional printed circuit board and a portion of a conventional printed circuit board module.
Figure 2:
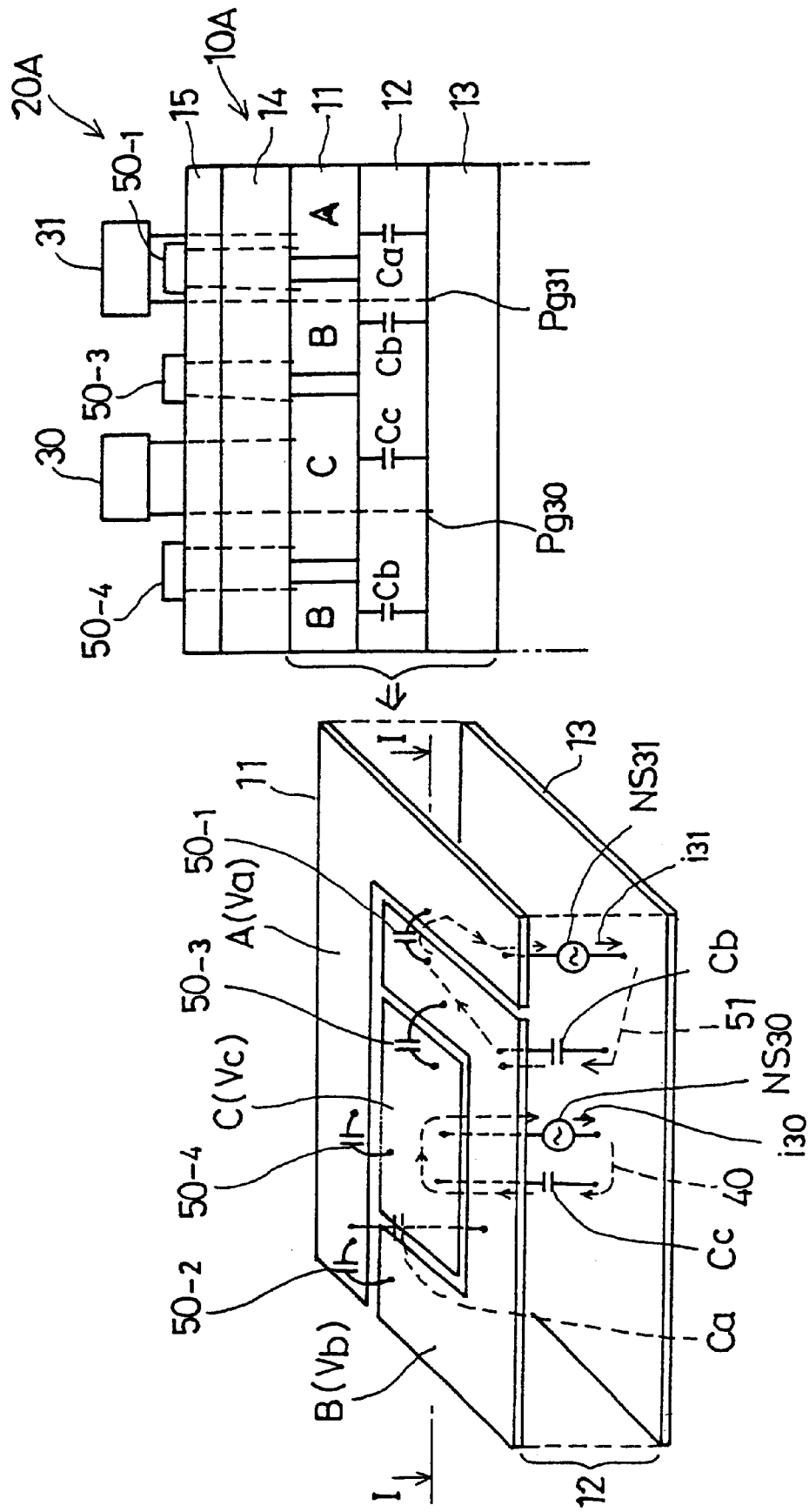
FIG. 2 is a diagram showing perspective and cross-sectional views of another conventional printed circuit board and printed circuit board module.

As a result, the area enclosed by the loop-like return path 83 is much smaller than the area enclosed by the return path 51 described above, so the printed circuit board 60 shows better electromagnetic wave radiation suppression than the conventional printed circuit board 20A shown in FIG. 2.

A description will now be given of a second embodiment of the present invention.

Figure 5:
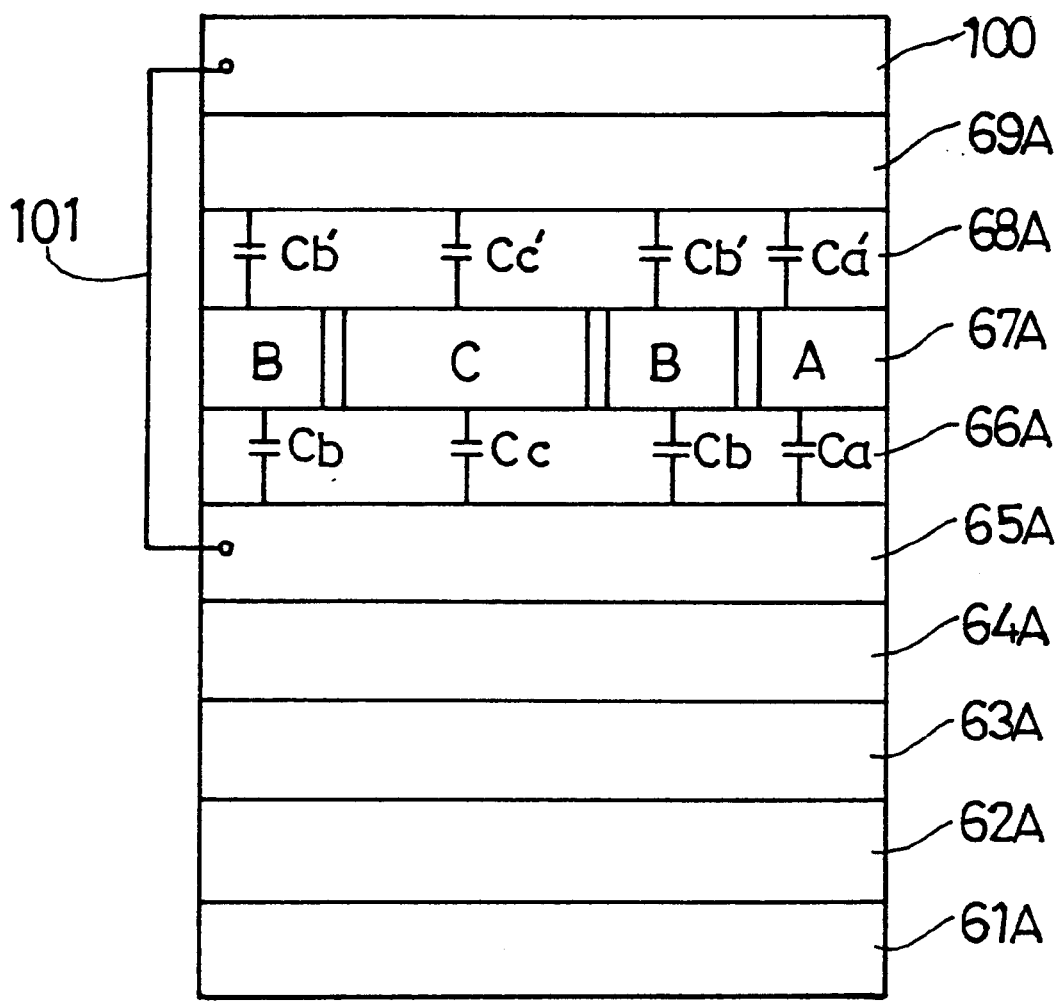
FIG. 5 is a diagram showing a printed circuit board according to a second embodiment of the present invention.

FIG. 5 shows a printed circuit board 60A according to a second embodiment of the present invention. In addition to electromagnetic wave radiation suppression, the printed circuit board 60A is also constructed to prevent the build-up of an electrostatic charge. The electromagnetic wave radiation suppression structure is the same as that for the printed circuit board 60 according to the first embodiment described above. Additionally, it should be noted that elements shown in FIG. 5 that correspond to elements shown in FIGS. 3 and 4 are given identical reference numbers with the letter "A" attached thereto.

The printed circuit board 60A shown in FIG. 5 comprises, in order from the bottom up: a signal layer 61A, a glass fabric based epoxy resin substrate layer 62A, a second signal layer 63A, a second glass fabric based epoxy resin substrate layer 64A, a ground layer 65A, a third glass fabric based epoxy resin substrate layer 66A, a power supply layer 67A, a dielectric layer 68A, a conductor layer 69A and a high-resistance conductor layer 100, with the high-resistance conductor layer 100 and the ground layer 65A electrically connected by a via hole 101. The high-resistance conductor layer 100 may be made of carbon fiber material, and has a relatively high resistance of several hundred kΩ to several MΩ. For ease of illustration the via hole 101 has been shown in schematic form.

The power supply layer 67A is divided into a plurality of lands A, B and C, electrically insulated from each other.

The high-resistance conductor layer 100 is exposed on a surface of the printed circuit board 60A. If this high-resistance conductor layer 100 were not so provided, then the conductor layer 69A would be exposed on the surface of the printed circuit board 60A. If the printed circuit board 60A were then to be mounted inside an electronic device in such an exposed state and if it were then to be exposed to a continuous air flow of forced cooling air, the friction generated between the air and the surface of the conductor layer 69A would make it easy for the conductor layer 69A to accumulate an electrostatic charge. If such an electrostatic charge accumulating on the conductor layer 69A were discharged to the air the electronic device may malfunction.

However, by covering the conductor layer 69A with the high-resistance conductor layer 100, the high-resistance conductor layer 100 and the ground layer 65A are electrically connected by the via hole 101, so the electrostatic charge accumulating on the high-resistance conductor layer 100 and caused by the friction between the air and the exposed surface of the conductor layer 100 is released immediately to the ground layer 65A by the via hole 101, so no discharge into the air occurs.

It should be noted that the high-resistance conductor layer 100 has a high resistance of from several hundred kΩ to several MΩ. Therefore, an electrostatic charge arising on the high-resistance conductor layer 100 and caused by the friction between the air and the exposed surface of the conductor layer 100 does not flow to the conductor layer 69A and hence no charge is accumulated in the conductor layer 69A.

A description will now be given of a third embodiment of the present invention.

Figure 6:
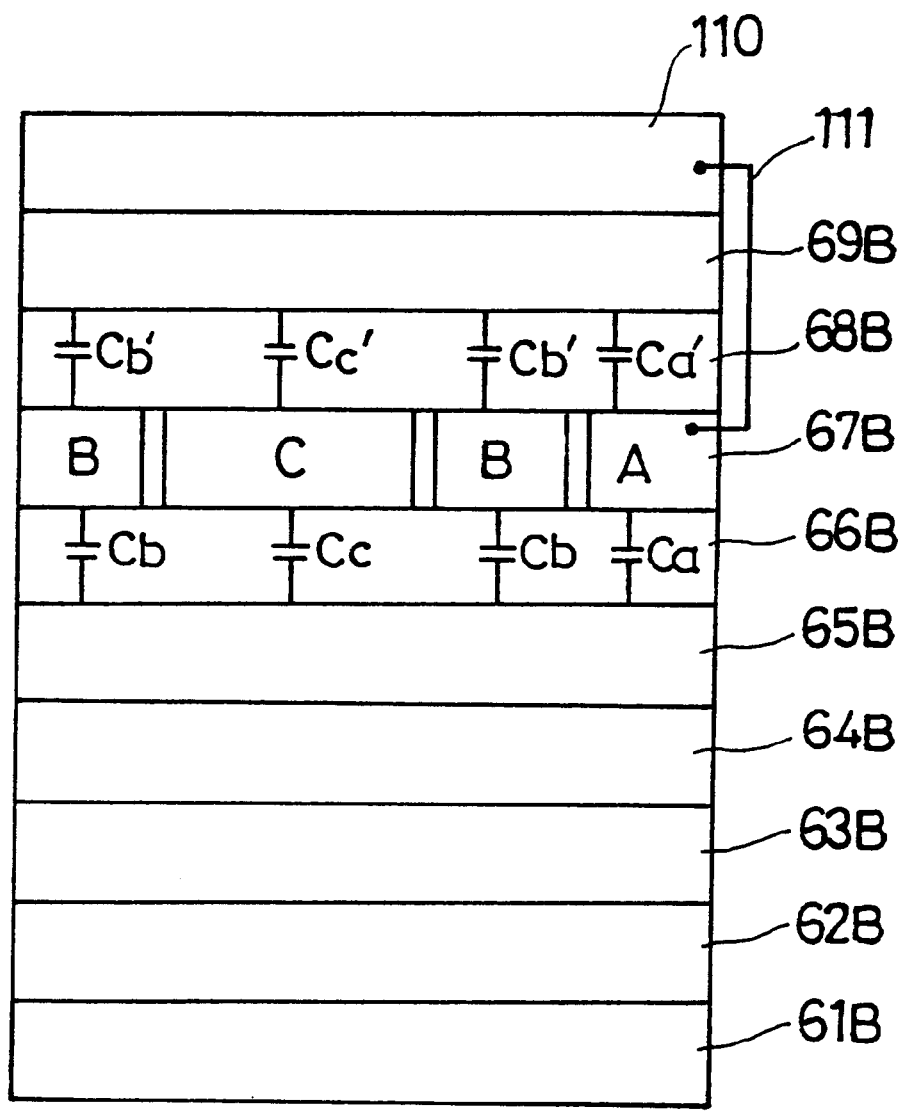
FIG. 6 is a diagram showing a printed circuit board according to a third embodiment of the present invention.

FIG. 6 shows a printed circuit board 60B according to a third embodiment of the present invention. The printed circuit board 60B, like the printed circuit board 60A described above, has an antistatic capability in addition to an electromagnetic wave radiation suppression capability, accomplished by the same structure. Accordingly, elements shown in FIG. 6 that correspond to elements shown in FIGS. 3 and 4 are given identical reference numbers with the letter "B" attached thereto.

The printed circuit board 60B comprises, in order from the bottom up: a signal layer 61B, a glass fabric based epoxy resin substrate layer 62B, a signal layer 63B, a glass fabric based epoxy resin substrate layer 64B, a ground layer 65B, a third glass fabric based epoxy resin substrate layer 66B, a power supply layer 67B, a dielectric layer 68B, a conductor layer 69B and a high-resistance conductor layer 110, with the high-resistance conductor layer 110 and the power supply layer 67B electrically connected by a via hole 111. The high-resistance conductor layer has a high resistance of several hundred kΩ to several MΩ. For ease of illustration the via hole 111 has been shown in schematic form.

The power supply layer 67B is divided into a plurality of lands A, B and C, each electrically insulated from the other. Land A has an area larger than those of the lands B and C, and it is to this land A that the high-resistance conductor layer 110 is electrically connected.

As shown in the diagram, the high-resistance conductor layer 110 is exposed at a surface of the printed circuit board 60B. If this high-resistance conductor layer 110 were not provided, then the conductor layer 69B would be exposed at the surface of the printed circuit board 60B. If the printed circuit board 60B were then to be mounted inside an electronic device in such an exposed state and if it were then to be exposed to a continuous air flow of forced air-cooling, the friction generated between the air and the surface of the conductor layer 69B would make it easy for the conductor layer 69B to accumulate an electrostatic charge. If such an electrostatic charge on the conductor layer 69B were discharged to the air the electronic device could malfunction.

However, by covering the conductor layer 69B with the high-resistance conductor layer 110, the high-resistance conductor layer 110 and the land A of the power supply layer 67B are electrically connected by the via hole 111, so the electrostatic charge accumulating on the high-resistance conductor layer 110 and caused by the friction between the air and the exposed surface of the conductor layer 110 is released immediately to the land A of the power supply layer 67B by the via hole 111, so no discharge into the air occurs.

It should be noted that the high-resistance conductor layer 100 has a high resistance of from several hundred kΩ to several MΩ. Therefore, the electrostatic charge accumulating on the high-resistance conductor layer 110 and caused by the friction between the air and the exposed surface of the conductor layer 110 does not flow to the conductor layer 69B and hence no charge is accumulated on the conductor layer 69B.

Additionally, it should be noted that a resistance element may be provided at an intermediate point along the via hole 111.

A description will now be given of a fourth embodiment of the present invention.

Figure 7:
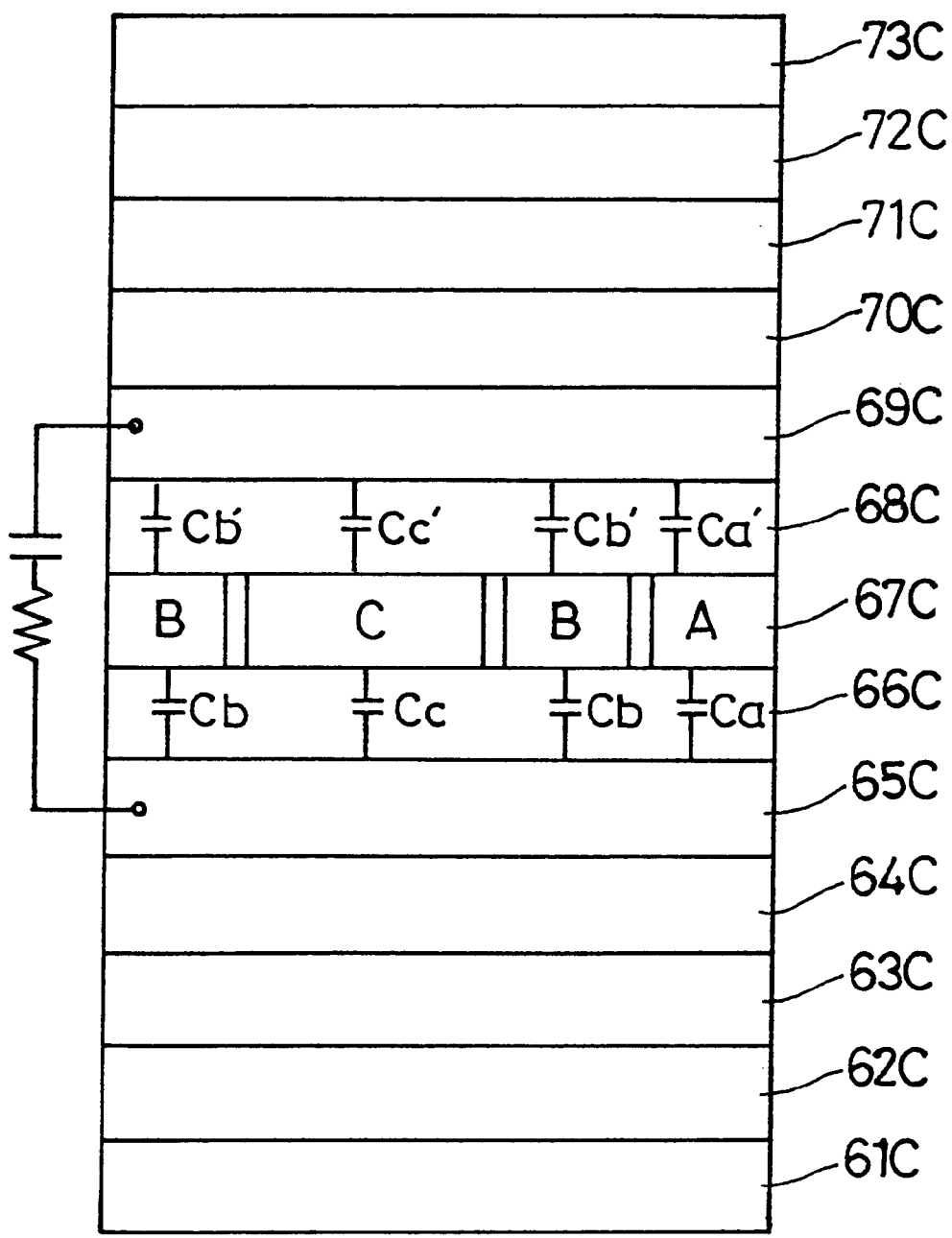
FIG. 7 is a diagram showing a printed circuit board according to a fourth embodiment of the present invention.
Figure 8:
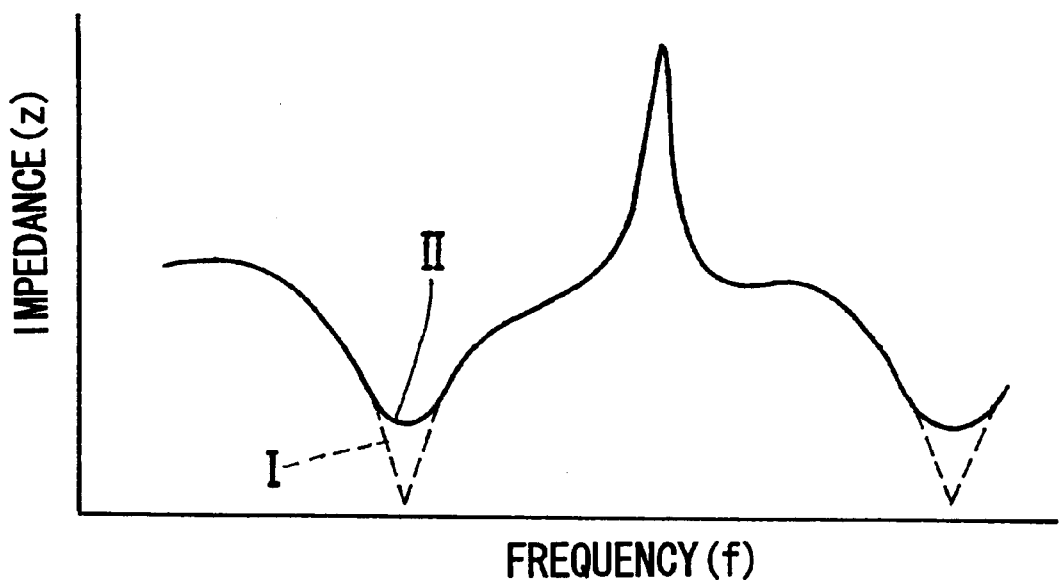
FIG. 8 is a diagram showing the impedance-resonance frequency characteristic of the printed circuit board shown in FIG. 7.

FIG. 7 shows a printed circuit board 60C according to a fourth embodiment of the present invention. FIG. 8 shows the impedance-frequency characteristic of the printed circuit board shown in FIG. 7.

As shown in the diagram, the printed circuit board 60C comprises, in order from the bottom up: a signal layer 61C, a glass fabric based epoxy resin substrate layer 62C, another signal layer 63C, a glass fabric based epoxy resin substrate layer 64C, a ground layer 65C, a third glass fabric based epoxy resin substrate layer 66C, a power supply layer 67C, a dielectric layer 68C, a conductor layer 69C, a fourth glass fabric based epoxy resin substrate layer 70C, a third signal layer 71C, a fifth glass fabric based epoxy resin substrate layer 72C and a fourth signal layer 73C.

The power supply layer 67C is divided into a plurality of lands A, B and C, electrically insulated from each other. Additionally, a capacitor C and a resistance R are connected in series between the conductor layer 69C and the ground layer 65C. The capacitance of the capacitor C may for example be approximately 1,000 pF and the resistance of the resistance R may for example be approximately 100Ω.

When a printed circuit board module having the printed circuit board 60C mounted with electronic elements is inserted inside an electronic device and the device operated, the electronic elements are operated at a predetermined switching frequency and a switching noise current is generated at that switching frequency. At the same time, the printed circuit board 60C itself has an impedance-frequency characteristic and resonance frequencies.

If the harmonics of the switching noise current generated at the above-described switching frequency match the resonance frequencies of the printed circuit board 60C, then the impedance of the loop-like return path 83 shown in FIG. 4 as described above drops to near zero as indicated by the dashed line I in FIG. 8, the switching noise current oscillates and the electromagnetic wave radiation level increases. In FIG. 8, the ordinate indicates the impedance in arbitrary units and the abscissa indicates the frequency in arbitrary units.

However, by providing an appropriate capacitor and an appropriate resistance connected in series between the conductor layer 69C and the ground layer 65C, the impedance at the resonance frequencies of the printed circuit board 60C is prevented from approaching zero, as shown by line II in FIG. 8.

Accordingly, the printed circuit board 60C not only suppresses radiation of electromagnetic waves caused by the noise current but also suppresses radiation of the electromagnetic waves caused by the harmonics of the noise current.

The above description is provided in order to enable any person skilled in the art to make and use the invention and sets forth the best mode contemplated by the inventor of carrying out the invention.

The present invention is not limited to the specifically disclosed embodiments and variations, and modifications may be made without departing from the spirit and scope of the present invention.

The present application is based on Japanese priority application No. 11-353726 filed on Dec. 13, 1999, the entire contents of which are hereby incorporated by reference.

What is claimed is:

1. A printed circuit board comprising:
    a ground layer;
    a power supply layer divided into a plurality of lands;
    a dielectric layer disposed so as to cover the plurality of lands of the power supply layer; and
    a conductor layer disposed so as to cover the dielectric layer,
    the plurality of divided lands being coupled to each other by electrostatic capacitors formed by each of the lands of the power supply layer and the conductor layer sandwiching the dielectric layer therebetween.

2. The printed circuit board as claimed in claim 1, wherein the dielectric layer has a relative dielectric constant of 20 to 100.

3. The printed circuit board as claimed in claim 1, further comprising:
    a high-resistance conductor layer which covers the surface of the conductor layer,
    the high-resistance conductor layer being electrically coupled to the ground layer.

4. The printed circuit board as claimed in claim 1, further comprising:
    a high-resistance conductor layer which covers the surface of the conductor layer,
    the high-resistance conductor layer being electrically coupled to the lands of the power supply layer.

5. The printed circuit board as claimed in claim 1, further comprising:
    a capacitor and a resistance which are coupled in series between the conductor layer and the ground layer.

6. The printed circuit board as claimed in claim 5, wherein the dielectric layer has a relative dielectric constant of 20 to 100.

7. The printed circuit board as claimed in claim 5, wherein the dielectric layer is made of a resin material.

8. The printed circuit board as claimed in claim 1, wherein at least two of said lands are arranged to be held at different voltages.

9. A printed circuit board module comprising:
    a printed circuit board,
    the printed circuit board comprising:
        a ground layer;
        a power supply layer divided into a plurality of lands;
        a dielectric layer disposed so as to cover the plurality of lands of the power supply layer; and
        a conductor layer disposed so as to cover the dielectric layer,
        the plurality of divided lands being coupled to each other by electrostatic capacitors formed by each of the lands of the power supply layer and the conductor layer sandwiching the dielectric layer therebetween.

10. The printed circuit board module as claimed in claim 9, wherein at least two of said lands are arranged to be held at different voltages.

11. The printed circuit board as claimed in claim 9, wherein the dielectric layer has a relative dielectric constant of 20 to 100.

12. An electronic device comprising:
    a printed circuit board module,
    the printed circuit board module comprising a printed circuit board,
    the printed circuit board comprising:
        a ground layer;
        a power supply layer divided into a plurality of lands;
        a dielectric layer disposed so as to cover the plurality of lands of the power supply layer; and
        a conductor layer disposed so as to cover the dielectric layer,
        the plurality of divided lands being coupled to each other by electrostatic capacitors formed by each of the lands of the power supply layer and the conductor layer sandwiching the dielectric layer therebetween.

13. The electronic device as claimed in claim 12, wherein at least two of said lands are arranged to be held at different voltages.

14. The printed circuit board as claimed in claim 12, wherein the dielectric layer has a relative dielectric constant of 20 to 100.

* * * * *